United States Patent
Gebara et al.

(10) Patent No.: US 7,949,482 B2
(45) Date of Patent: May 24, 2011

(54) DELAY-BASED BIAS TEMPERATURE INSTABILITY RECOVERY MEASUREMENTS FOR CHARACTERIZING STRESS DEGRADATION AND RECOVERY

(75) Inventors: Fadi H. Gebara, Austin, TX (US); Jerry D. Hayes, Georgetown, TX (US); John P. Keane, Minneapolis, MN (US); Sani R. Nassif, Austin, TX (US); Jeremy D. Schaub, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 336 days.

(21) Appl. No.: 12/142,294

(22) Filed: Jun. 19, 2008

(65) Prior Publication Data

US 2009/0319202 A1     Dec. 24, 2009

(51) Int. Cl.
  *G01L 1/00* (2006.01)
(52) U.S. Cl. .......................................... 702/42
(58) Field of Classification Search .................... 702/42; 324/762.09, 763.01; 365/239, 201; 330/2
  See application file for complete search history.

(56) References Cited

U.S. PATENT DOCUMENTS

| | | | |
|---|---|---|---|
| 5,537,054 A | 7/1996 | Suzuki et al. | |
| 6,020,751 A * | 2/2000 | Rampone et al. | 324/763.01 |
| 6,342,790 B1 | 1/2002 | Ferguson et al. | |
| 6,521,469 B1 | 2/2003 | La Rosa et al. | |
| 6,731,179 B2 | 5/2004 | Abadeer et al. | |
| 6,815,970 B2 | 11/2004 | Rost et al. | |
| 7,038,482 B1 | 5/2006 | Bi | |
| 7,103,861 B2 | 9/2006 | Ang et al. | |
| 7,212,023 B2 * | 5/2007 | Krishnan et al. | 324/762.09 |
| 7,525,333 B1 | 4/2009 | Bertin | |
| 2006/0261840 A1 | 11/2006 | Hoon et al. | |
| 2009/0167429 A1 * | 7/2009 | Reddy et al. | 330/2 |
| 2009/0245013 A1 * | 10/2009 | Chandra et al. | 365/239 |
| 2009/0285044 A1 * | 11/2009 | Chen et al. | 365/201 |

OTHER PUBLICATIONS

Wang et al., "The impact of NBTI on the performance of combinational and sequential circuits", Annual ACM IEEE Design Automation Conference, Proceedings of the 44th annual Design Automation Conference, San Diego, California, 2007, pp. 364-369.*
U.S. Appl. No. 11/750,385, filed May 18, 2007, Singh, et al.
U.S. Appl. No. 11/750,475, filed May 18, 2007, Singh, et al.
U.S. Appl. No. 12/061,077, filed Apr. 2, 2008, Agarwal, et al.

(Continued)

*Primary Examiner* — Drew A Dunn
*Assistant Examiner* — Xiuquin Sun
(74) *Attorney, Agent, or Firm* — Mitch Harris, Atty at Law, LLC; Andrew M. Harris; Libby Z. Toub

(57) ABSTRACT

A method, test circuit and test system provide measurements to accurately characterize threshold voltage changes due to negative bias temperature instability (NBTI) and positive bias temperature instability (PBTI). Both the bias temperature instability recovery profile and/or the bias temperature shifts due to rapid repetitions of stress application can be studied. In order to provide accurate measurements when stresses are applied at intervals on the order of tens of nanoseconds while avoiding unwanted recovery, and/or to achieve recovery profile sampling resolutions in the nanosecond range, multiple delay or ring oscillator frequency measurements are made using a delay line that is formed from delay elements that have delay variation substantially caused only by NBTI or PBTI effects. Devices in the delay elements are stressed, and then the delay line/ring oscillator is operated to measure a threshold voltage change for one or more measurement periods on the order of nanoseconds.

15 Claims, 8 Drawing Sheets

OTHER PUBLICATIONS

Keane, et al., "An On-chip NBTI Sensor for Measuring PMOS Threshold Voltage Degradation", International Symposium on Low Power Electronics and Design 2007, pp. 189-194, Portland, OR.

Earle, et al., "Compact In-Situ Sensors for Monitoring Negative-Bias-Temperature-Instability Effect and Oxide Degradation", IEEE ISSC Conference 2008, pp. 410-411 and 623, San Francisco, CA.

Ketchen, et al., "Ring Oscillator Based Test Structure for NBTI Analysis", IEEE International Conference on Microelectronic Test Structures 2007, pp. 42-47, Tokyo, Japan.

Kim, et al., "Silicon Odometer: An On-Chip Reliability Monitor for Measuring Frequency Degradation of Digital Circuits", 2007 Symposium on VLSI Circuits, Digest of Technical Papers, pp. 122-123, Kyoto Japan.

Kim, at al., IEEE Journal of Solid-State Circuits, vol. 43, No. 4, pp. 874-880, Apr. 2008.

Bhushan, et. al. "Ring Oscillator Based Technique for Measuring Variability Statistics", International Conference on Microelectronic Test Structures Mar. 6-9 2006, IEEE Press 2006 pp. 87-92.

Reisinger, et al., "Analysis of NBTI Degradation- and Recovery-Behavior Based on Ultra Fast $V_T$-Measurements", IEEE 44th Annual International Reliability Physics Symposium, San Jose. 2006. pp. 448-453.

Shen, et al., "Characterization and Physical Origin of Fast $V_{TH}$ Transient in NBTI of pMOSFETs with SiON Dielectric", IEDM Technical Digest, pp. 333-336, Dec. 2006.

* cited by examiner

DELAY-BASED BIAS TEMPERATURE INSTABILITY RECOVERY MEASUREMENTS FOR CHARACTERIZING STRESS DEGRADATION AND RECOVERY

BACKGROUND OF THE INVENTION

1. Field of the Invention

The present invention is related to device characterization methods and circuits, and more particularly to delay-based techniques for characterizing bias temperature instability effects.

2. Description of Related Art

As geometry and power supply voltages in very large-scale integrated circuits (VLSI) such as semiconductor memories and microprocessors are decreased, the effect of threshold voltage variation has become increasingly significant. Not only do process variation changes in threshold voltage cause variation from device-to-device, but effects such as negative bias temperature instability (NBTI) and positive bias temperature instability (PBTI) cause changes in performance that are time and stress dependent. The mechanisms behind NBTI and PBTI, referred to generally as bias temperature instability (BTI) are not fully understood, and measurements of their effects have been limited by their time-dependent nature, particularly due to the fast partial recovery of observed threshold voltage shifts due to BTI after stress is removed.

NBTI effects are seen when a negative gate voltage stress is applied to a P-channel metal-oxide semiconductor (MOS) transistor, and the effects diminish rapidly during the recovery time immediately following the removal of the stress. Similarly, PBTI effects are seen in N-channel MOS devices, particularly in those with high-k gate dielectrics. Therefore, in order to properly characterize BTI effects, in particular to simulate aging by applying a stress and measuring a change in threshold voltage before recovery, and also to gain insight into the mechanisms causing BTI, it is desirable to measure threshold voltage not only during the application of the stress and immediately after removal of the stress, but to characterize the entire transient threshold voltage recovery evolution after stress.

Present BTI measurement techniques provide threshold voltage recovery observation on the order of microseconds and later. Some techniques directly measure a threshold voltage change during BTI recovery by observing voltages a terminals of one or more transistors to which a stress has been previously applied, while others use techniques such as ring oscillator measurements that measure a beat frequency between a ring oscillator having stressed devices and a ring oscillator having un-stressed devices. However, existing techniques do not provide a sufficiently high resolution with respect to the recovery time to permit the BTI recovery to be characterized in the sub-microsecond range or to permit characterization of changes in recovery during repetitive stress applications at rates on the order of microseconds or faster. Such repetitive stress application is highly desirable for characterizing the long-term aging effects of BTI. Further, some of the existing techniques fail to isolate only one type of BTI effect (NBTI or PBTI without other effects such as Hot Carrier Injection), and also may fail to eliminate other factors in the measurement process caused by the application of stress.

Therefore, it would be desirable to provide methods, circuits and systems for BTI characterization that measures recovery characteristics from BTI effects in the sub-microsecond region, as well as the effects of continuous stress experiments while minimizing the unwanted threshold voltage recovery when stress conditions are temporarily removed to perform each measurement. It would further be desirable to provide such BTI characterization that measures the BTI effects after repetitive applications of stress, i.e. AC stress, at repetition periods of a microsecond and faster.

BRIEF SUMMARY OF THE INVENTION

Measurement of NBTI/PBTI effects, under AC (repetitive) stress conditions simulating actual aging and/or with high resolution in the sub-microsecond range, is provided in a circuit, method of measurement and a measurement system.

A delay line, which may form a ring oscillator, is formed from delay elements having transistors to which a stress that induces a pure NBTI or PBTI effect is applied. The stress is removed and the delay or ring oscillator frequency is measured to determine a change in threshold voltage due to the stress. If a ring oscillator is used, the ring oscillator operation is gated, and an edge detector is used to determine an absolute delay within the resolution of a delay of a single delay element at the end of a capture period. An overflow counter may be used to extend the dynamic range of the measurement without requiring a larger number of delay elements. If a delay line is used without forming a ring oscillator, then the number of delay elements is made large enough to encompass the delay range of interest and the edge is detected from its position within the delay chain at the end of the capture period.

The delay element may be designed to speed up the edge of the pulse that propagates more slowly through the previously stressed device (e.g., the low state propagated through a PMOS device). The result is an increase in the resolution of a ring oscillator frequency measurement by increasing rate at which the pulse propagates through the delay line.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention relates to test circuits and methodologies for measuring time-variant effects on threshold voltage due to stress. In particular, the present invention provides a measurement of NBTI and PBTI in the nanosecond range in order to avoid unwanted recovery from affecting the measurements, and so that repetitive measurements of device threshold voltage can be made as the devices recover from either DC or AC stress conditions, in which sequential measurements can be performed on the order of a microsecond. By taking the measurements at intervals in the nanosecond range, BTI effects accumulate in the stressed devices without substantial unwanted recovery, permitting simulation of longer aging periods in a short test interval. In a quasi-continuous stress mode, stress is applied to devices and is only interrupted during measurement periods, which are performed in a very short interval. Due to the power-law nature of the threshold voltage degradation, measurements can be spaced logarithmically in time, in particular to save measurement storage space, which may be located on-die, or to reduce the bandwidth requirements of the measurement interface. The present invention also provides a technique for accurately measuring fast transient threshold voltage recovery profiles, so that even the earliest portions of BTI recovery can be studied at high resolution. In a recovery characterization mode, stress is applied for some period of time, and then removed so that the recovery can be sampled at a high rate.

Figure 1:
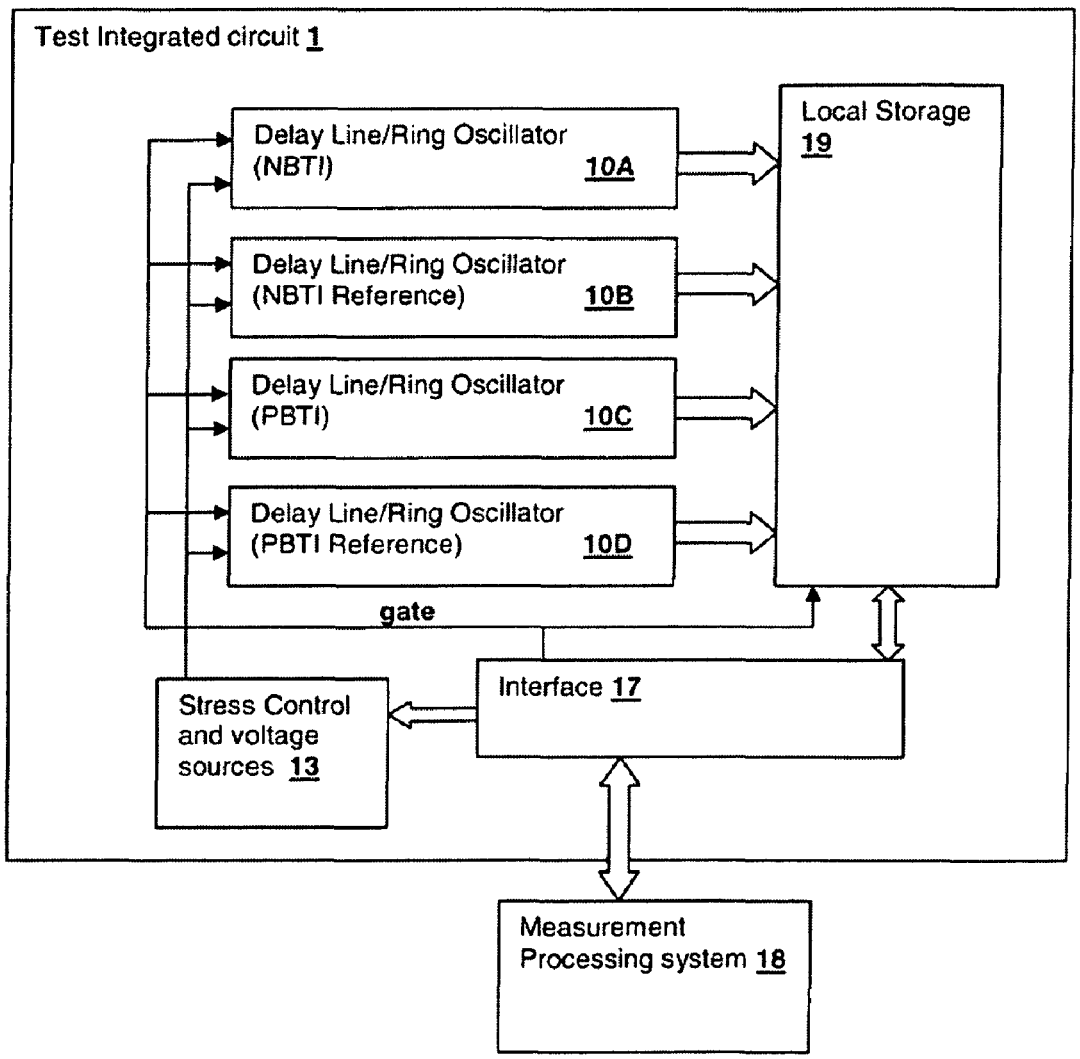
FIG. 1 is a block diagram of a test integrated circuit according to an embodiment of the present invention.

Referring now to FIG. 1, a test integrated circuit 1 in accordance with an embodiment of the present invention is shown. Test integrated circuit 1 includes delay line/ring oscillators 10A, 10B, 10C and 10D. Delay line/ring oscillators 10A and 10B are identical and include P-type transistors that exhibit a change in threshold voltage due NBTI after a stress has been applied. However, none of the devices in delay line/ring oscillator 10B are stressed prior to operation, so that delay line/ring oscillator 10B provides a reference measurement. Rather than applying a stress voltage to the devices in delay line/ring oscillator 10B, the devices are provided with their nominal operating voltages, so that the stress measurements can be referenced to a delay line operating under normal operating conditions. Similarly, delay line/ring oscillators 10C and 10D are identical and include N-type transistors that exhibit a change in threshold voltage to PBTI after stress has been applied. Delay line/ring oscillator 10D is not stressed in operation and serves as a reference for delay line/ring oscillator 10C. A stress control and voltage source circuit 13 provides stress voltages to delay line/ring oscillators 10A and 10C under control of an external measurement processing system 18. The stress is removed and a gate control signal is provided from an interface 17 under control of external measurement processing system 18 to initiate a pulse and provide a predetermined window during which the pulse propagates (and re-circulates if delay line/ring oscillators 10A-10D are configured as ring oscillators) and at the end of which, the position of the edge of the pulse is observed for each of delay line/ring oscillators 10A-10D.

A local storage 19 may be provided to store delay indications from each delay line/ring oscillator 10A-10D due to the rate at which the measurements are made. Typical scan chain interfaces are generally not fast enough to collect the data generated by test integrated circuit 1 without the provision of local storage 19, so unless the test results are cached (e.g., by a FIFO memory or other storage), interface 17 will need to include a high-speed interface such as a serial link operating at a rate sufficient to transfer the full resolution of the measurements for each of delay line/ring oscillators 10A-10D at the rate of repetition of the measurements. For example, if the resolution of edge detection circuits/ring oscillator counters within delay line/ring oscillators 10A-10D is 1000 and the measurement rate is 1 µs per stress interval, interface 17 needs to transfer data at 4 Gb/s if local storage 19 is not provided and data is provided from four delay line/ring oscillators 10A-10D. Otherwise, interface 17 may be an ordinary test interface such as a scan chain interface that reads values from local storage 19 after testing has completed. Test integrated circuit 1 is provided as an example of a particular test configuration, and should not be construed as limiting the present invention to a particular configuration. For example, NBTI-only implementations can be alternatively fabricated, PBTI-only implementations can be alternatively fabricated and reference delay/ring oscillators 10B and 10D are not required, in particular when NBTI and PBTI variation is being observed across a die or lot. Further, while only four delay line/ring oscillators 10A-10D are shown, if an entire die (or substantial portions of the die) is dedicated to the tests and circuits of the present invention, large numbers of delay line/ring oscillators may be distributed across the die.

Figure 2:
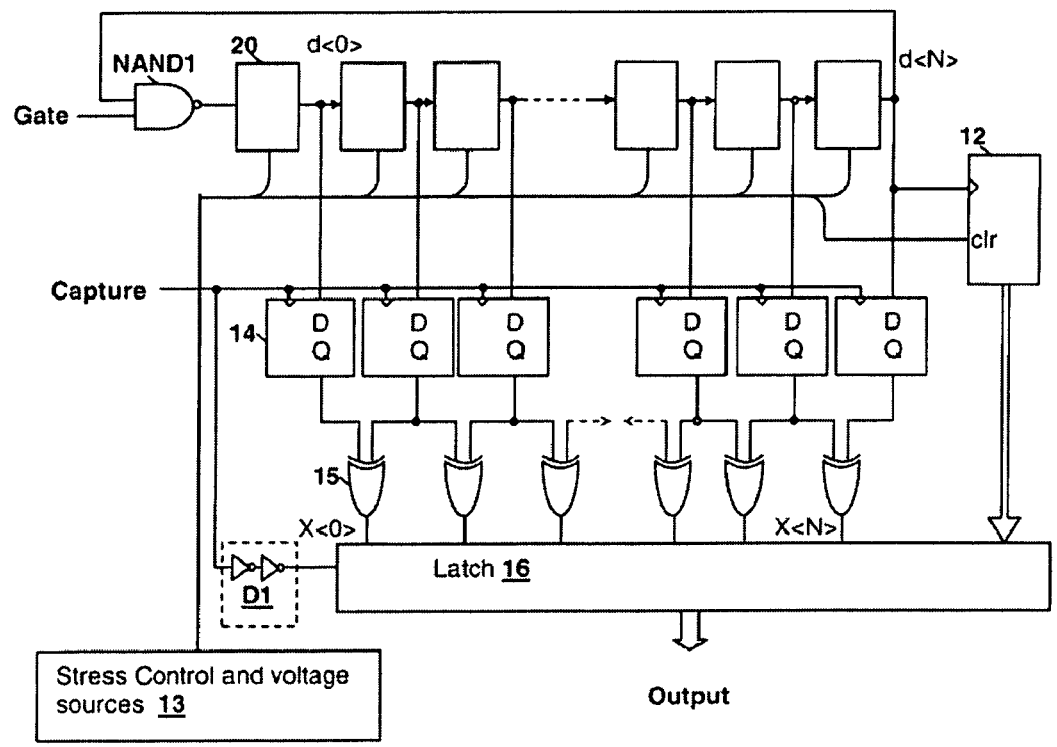
FIG. 2 is a block diagram of a delay line/ring oscillator within test integrated circuit 1 of FIG. 1 according to an embodiment of the present invention.

Referring now to FIG. 2, details of a ring oscillator circuit, in accordance with an embodiment of the invention, that may be used to implement delay lines 10A-10D of FIG. 1, is shown. The ring oscillator circuit is formed from multiple delay elements 20, which are shown connected to stress control and voltage sources 13. The outputs of delay elements 20 are connected to the inputs of flip-flops 14 which capture the state of the outputs of the delay element 20 when a Capture signal is asserted a predetermined time after the Gate signal is asserted. The outputs of adjacent pairs of flip-flops 14 are connected to inputs of logical exclusive-OR gates 15 that form an edge detector. The position of the edge of the pulse within the delay line formed by the chain of delay elements 20 will be indicated by a logical "1" at the output X<0:N> of only one of exclusive-OR gates 15 and the rest of the outputs X<0:N> of exclusive-OR gates 15 will be in a logical "0" state. A latch 16 captures the outputs of exclusive-OR gates 15 along with the count value of a counter 12 which counts oscillations of a ring oscillator that is formed by providing feedback from the last one of delay elements 20 to the input of a logical-NAND gate NAND1. A delay circuit D1 provides the clock input to latch 16, ensuring that the outputs of exclusive-OR gates 15 are stable at the time of edge capture. When signal Gate is de-asserted, the output of logical-NAND gate NAND1 is in a logical "1" state, as are each of delay elements 20. When signal Gate is asserted, the output of logical-NAND gate NAND1 transitions to a logical "0" state, propagating a pulse through delay elements 20 and commencing oscillation of the ring oscillator circuit. Unlike frequency-only measurement circuits, the circuit of FIG. 2 provides a "phase" indication as well, from the edge-detecting outputs of exclusive-OR gates 15, so that the resolution of the test circuit is limited only by the delay of the individual delay elements 20.

Figure 3A:
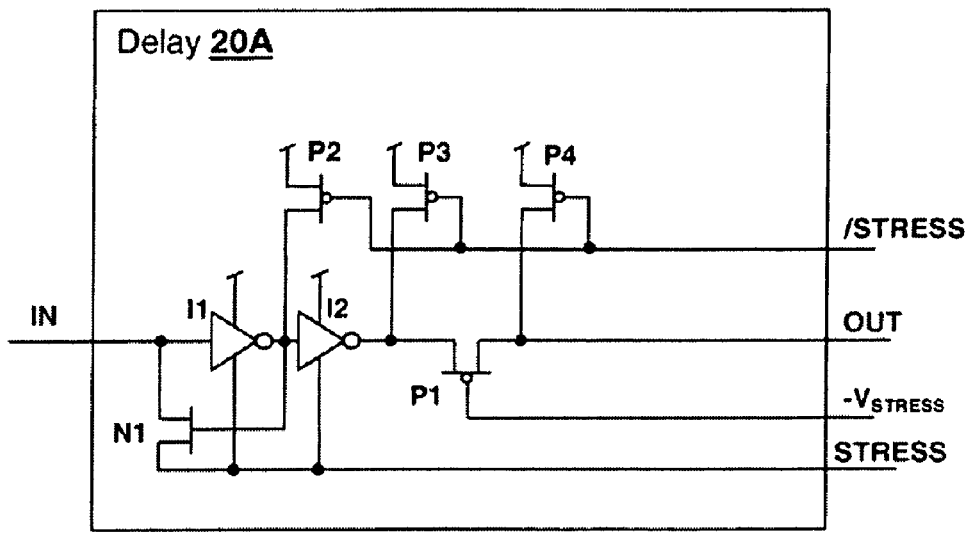
FIG. 3A is a schematic diagram of a delay element 20A that can be used as delay element 20 in the delay line of FIG. 2 in accordance with an embodiment of the present invention, in order to measure NBTI effects.

Referring now to FIG. 3A, a schematic diagram of a delay element 20A suitable for use in the ring oscillator of FIG. 2 and for measuring NBTI effects is shown. A pair of inverters I1 and I2, provide a non-inverting characteristic to delay element 20A and provide a drive level for propagating the ring oscillator signal through a transistor P1 that was previously stressed by application of a stress voltage $-V_{STRESS}$ at its gate terminal. During application of the stress, logical signal STRESS is active (logical "1") and logical signal /STRESS is also active (logical "0"), so that transistors P2-P4 are "on" and the lower power supply rail of inverters I1-I2 is raised to the upper power supply rail level ($V_{CC}$). Therefore, all of the terminals of transistor P1 are at potential $V_{CC}$ except for the gate terminal, which is held at potential $-V_{STRESS}$. Transistor P1 is the only stressed device in delay element 20A and effects on its threshold voltage are substantially only due to NBTI caused by the application of potential $-V_{STRESS}$ at the gate of transistor P1. (A typical value for $-V_{STRESS}$ is $-V_{CC}$ and many levels of $-V_{STRESS}$ will generally be studied in different sequences of measurement.) After the stress has been applied for a predetermined time, logical signals STRESS and /STRESS are de-asserted, providing a ground level at the lower power supply rail of inverters I1 and I2 and turning off transistors P2-P4. Delay stage 20A now acts as a buffer with transistor P1 providing an active pass-gate having a rise time that varies almost linearly with variation in the threshold voltage of transistor P1. Since the variation in threshold voltage is substantially only caused by the NBTI effect, the delay time through the delay line of FIG. 2 using delay elements 20A and for a logical "1" pulse is substantially linear with NBTI effect on threshold voltage, providing a direct measurement of the threshold voltage.

However, in the ring oscillator of FIG. 2, both states of the propagating pulse contribute to the frequency (and ultimate "phase") of the measurement. The fall time of delay element 20A would generally be much longer than the rise time and is relatively insensitive to threshold voltage variation in transistor P1. In order to reduce the fall time of delay element 20A and therefore reduce the effect of its variation on the overall frequency/phase measurement, transistor N1 is included as a "speed-up" device. As soon as inverter I1 begins to transition to a logical "1" state, transistor N1 is turned on to rapidly pull down the input of inverter I1, reducing the fall time of delay element 20A.

Figure 3B:
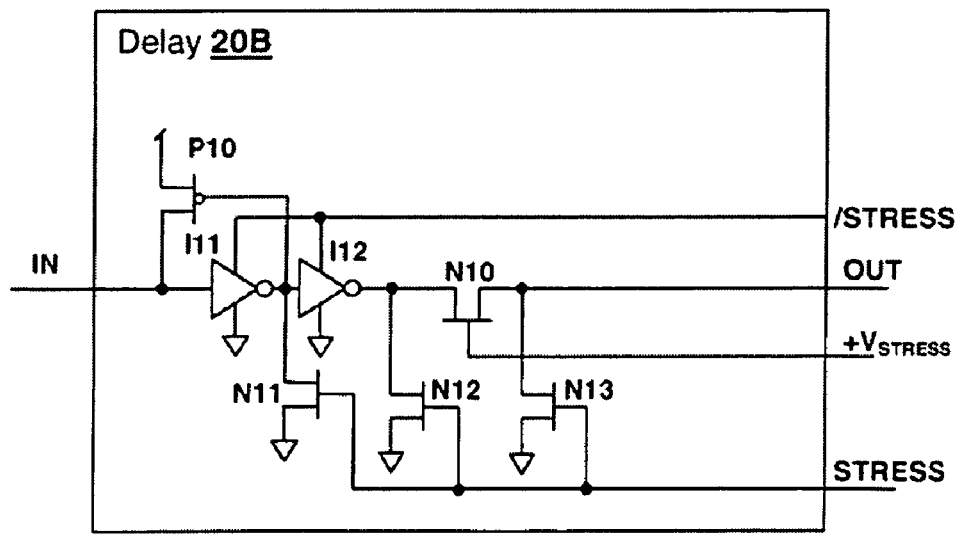
FIG. 3B is a schematic diagram of a delay element 20B that can be used as delay element 20 in the delay line of FIG. 2 in accordance with an embodiment of the present invention in order to measure PBTI effects.

Referring now to FIG. 3B, a schematic diagram of a delay element 20B suitable for use in the ring oscillator of FIG. 2 and for measuring PBTI effects is shown. Delay element 20B is similar to delay element 20A of FIG. 3A, and therefore only differences between them will be described below. In delay element 20B, transistor N10 is stressed by application of a stress voltage $V_{STRESS}$ at its gate terminal. During application of the stress, transistors N11-N13 are "on" and the upper power supply rail of inverters I11-I12 is lowered to ground. Therefore, all of the terminals of transistor N10 are at ground except for the gate terminal, which is held at potential $V_{STRESS}$. (A typical value for $V_{STRESS}$ is $V_{CC}$ and many levels of $V_{STRESS}$ will generally be studied in different sequences of measurement.) When logical signals STRESS and /STRESS are de-asserted, $V_{CC}$ is provided at the upper power supply rail of inverters I11 and I12 and transistors N11-N13 are turned off. Delay stage 20B acts as a buffer with transistor N10 providing an active pass-gate having a fall time that varies almost linearly with variation in the threshold voltage of transistor PN10. The delay time through the delay line of FIG. 2 using delay element 20B and for a logical "0" pulse is substantially linear with PBTI effect on threshold voltage, providing a direct measurement of the threshold voltage. As in delay element 20A of FIG. 3A, both states of the propagating pulse contribute to the frequency (and ultimate "phase") of the measurement in the circuit of FIG. 2. The rise time of delay element 20B would generally be much longer than the fall time and is relatively insensitive to threshold voltage variation in transistor N10. In order to reduce the rise time of delay element 20B and therefore reduce the effect of its variation on the overall frequency/phase measurement, transistor P10 is included as a "speed-up" device. As soon as inverter I11 begins to transition to a logical "0" state, transistor P10 is turned on to rapidly pull up the input of inverter I11, reducing the fall time of delay element 20B.

Figure 4A:
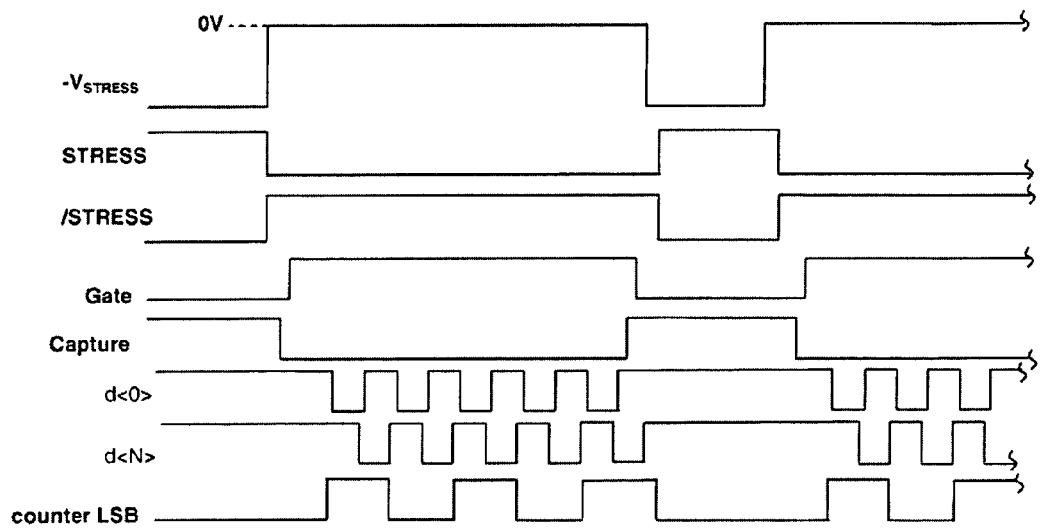
FIG. 4A is a signal diagram showing signals within the test integrated circuit of FIG. 1 in accordance with an embodiment of the present invention, while measuring NBTI effects.
Figure 4B:
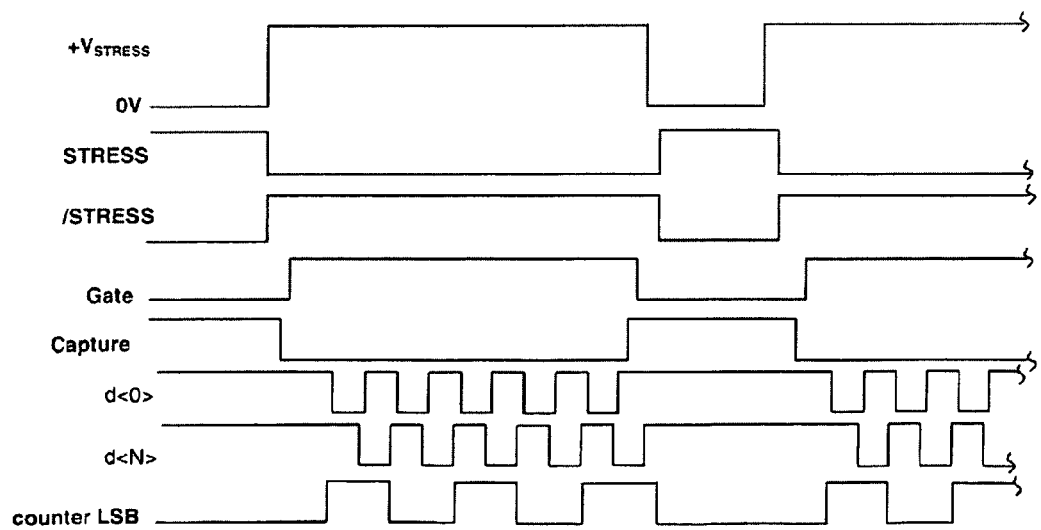
FIG. 4B is a signal diagram showing signals within the test integrated circuit of FIG. 1 in accordance with an embodiment of the present invention, while measuring PBTI effects.

Referring now to FIG. 4A, signals within the ring oscillator of FIG. 2 using delay element 20A of FIG. 3A are shown. Assertion of the logical stress control signals STRESS, /STRESS coincides with the application of stress voltage $-V_{STRESS}$ to the gate of transistors P10 in each delay element 20. When the stress is removed, the gate control signal Gate is asserted and the ring oscillator begins to oscillate, with signals appearing on the outputs of delay elements 20 shown as d<0> through d<N>. The counter counts oscillations of signal d<N> and the LSB of the counter is shown as signal counter LSB. When capture signal Capture is asserted the count value and edge position are captured and stored (or transmitted to the test system). Signal Gate can be generated from signal Capture by delaying and inverting signal Capture, as can be seen from the Figure. Referring now to FIG. 4B, signals within the ring oscillator of FIG. 2 using delay element 20B of FIG. 3B are shown. FIG. 4B is similar to FIG. 4A, with the exception of the polarity of the stress voltage $+V_{STRESS}$, and therefore the above description applies to FIG. 4B, as well. After the measurement has been performed, if the measurements are being performed in quasi-continuous stress mode, then, as shown in FIGS. 4A-4B, logical stress control signals STRESS, /STRESS are re-asserted and stress voltage $-V_{STRESS}$ is reapplied after the measurement interval. If the recovery transient is being studied, then the stress is not reapplied and measurements are repeatedly taken, and may be spaced logarithmically with increasing time separation to reduce storage and bandwidth requirements.

Figure 5:
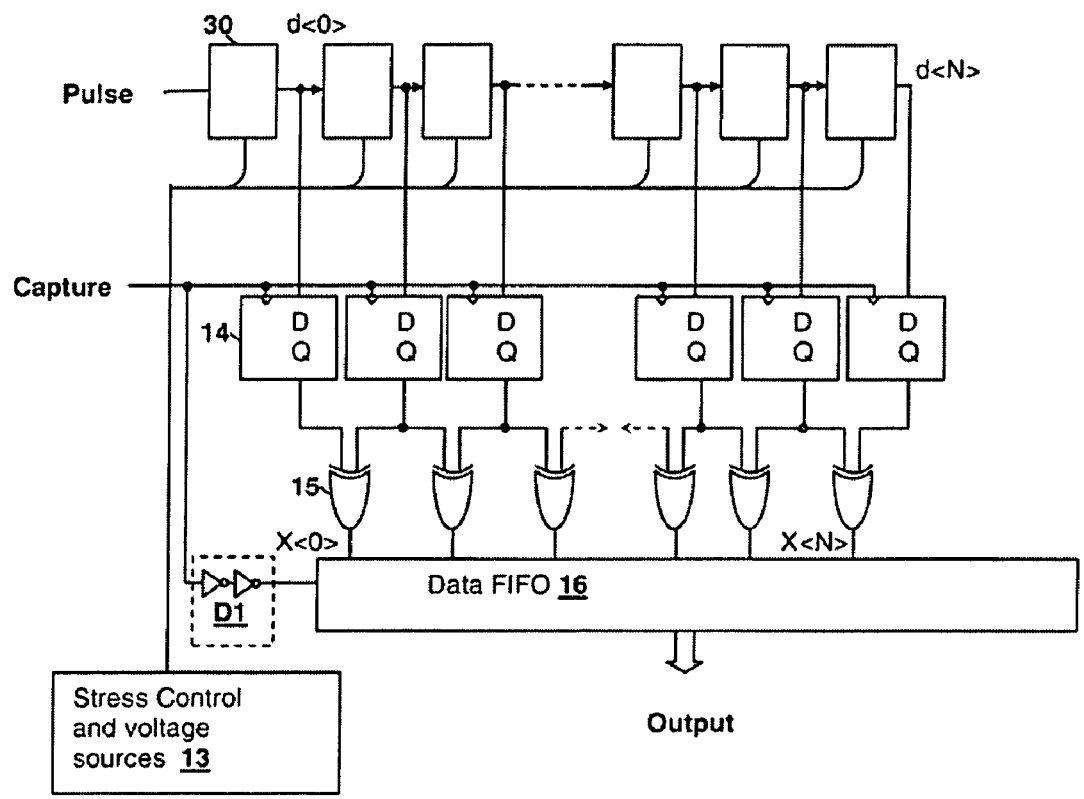
FIG. 5 is a block diagram of a delay line according to another embodiment of the present invention that may be used within the test integrated circuit of FIG. 1.

Referring now to FIG. 5, details of a delay line circuit ring oscillator circuit, in accordance with another embodiment of the invention, that may be used to implement delay lines 10A-10D of FIG. 1, is shown. The delay line circuit of FIG. 5 is similar to the ring oscillator circuit of FIG. 2, and therefore only differences between them will be described below. In the delay line circuit of FIG. 5, logical-NAND gate NAND1 and counter 12 are omitted and a pulse signal Pulse is supplied directly to the first delay element 30. Therefore, to obtain the same measurement range, a much larger number of delay elements 30 are used. Further, since there is only a one-shot delay, delay elements 30 are slightly different in implementation than the delay elements 20 as illustrated in delay elements 20A and 20B of FIG. 3A and FIG. 3B above.

Figure 6A:
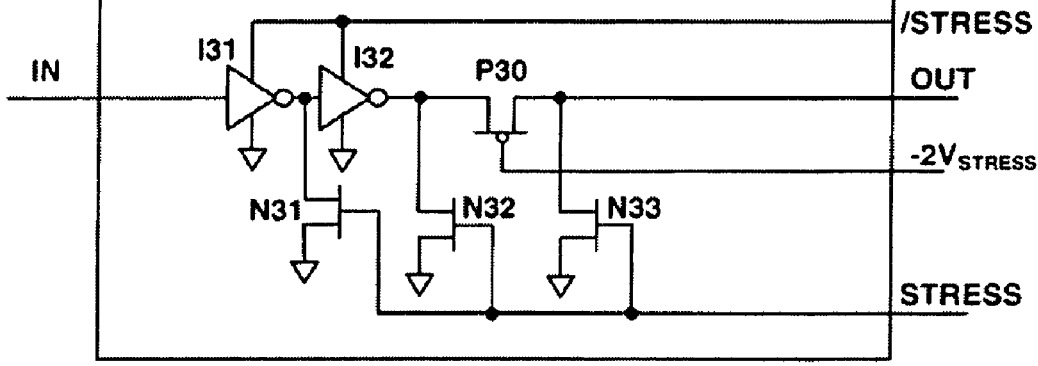
FIG. 6A is a is a schematic diagram of a delay element 30A that can be used as delay element 30 in the delay line of FIG. 5 in accordance with an embodiment of the present invention, in order to measure NBTI effects.
Figure 6B:
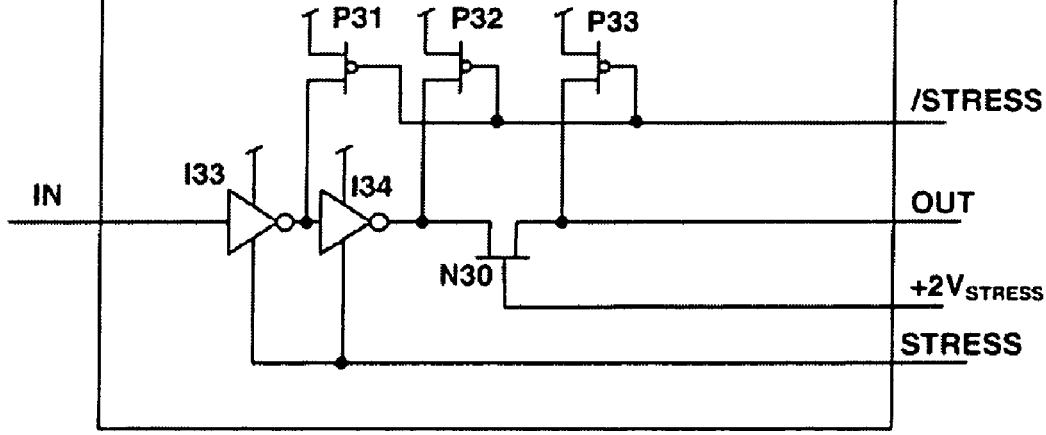
FIG. 6B is a is a schematic diagram of a delay element 30B that can be used as delay element 30 in the delay line of FIG. 5 in accordance with an embodiment of the present invention, in order to measure PBTI effects.

Referring now to FIG. 6A and to FIG. 6B, delay elements 30A and 30B are illustrated, respectively. Delay element 30A of FIG. 6A is used for measuring NBTI effects in transistor P30, but has a design similar to the PBTI measurement delay element 20B of FIG. 3B, in that transistors N31, N32 and N33 force the drain and source terminals of transistor P30 to ground during the assertion of signal STRESS. A speed-up transistor is not needed, since the NTBI-insensitive state does not form part of the delay measurement in the circuit of FIG. 5. Inverters I31 and I32 buffer signal Pulse as it arrives at each delay element 30A and have their upper power supply rail set to ground during stress application. For delay elements 30A, pulse is a positive polarity pulse. Therefore, as mentioned above, the slow fall time of delay element 30A does not affect the measurement. The stress voltage, shown as $-2V_{STRESS}$ is increased over that supplied to delay element 20A of FIG. 3A in order to obtain the same stress. (The equivalent stress voltage is actually $-V_{STRESS}-V_{CC}$, since the drain and source of transistor P30 are held at ground instead of $V_{CC}$ during stress.) Delay element 30B of FIG. 6B is similarly changed with respect to the PBTI-sensitive delay element 20B of FIG. 3B. No speed-up device is needed, since the slow rise time of delay element 30B does not form part of the measurement, which is initiated with a negative polarity pulse that transitions from $V_{CC}$ to ground. The drain and source of transistor N30 are held at $V_{CC}$ by transistors P31-P33 during stress, and the gate voltage for equivalence to delay element 20B of FIG. 3B is therefore $V_{STRESS}+V_{CC}$, and is shown as $2V_{STRESS}$. Inverters I33 and I34 have their lower power supply rail set to $V_{CC}$ during the stress application.

Figure 7:
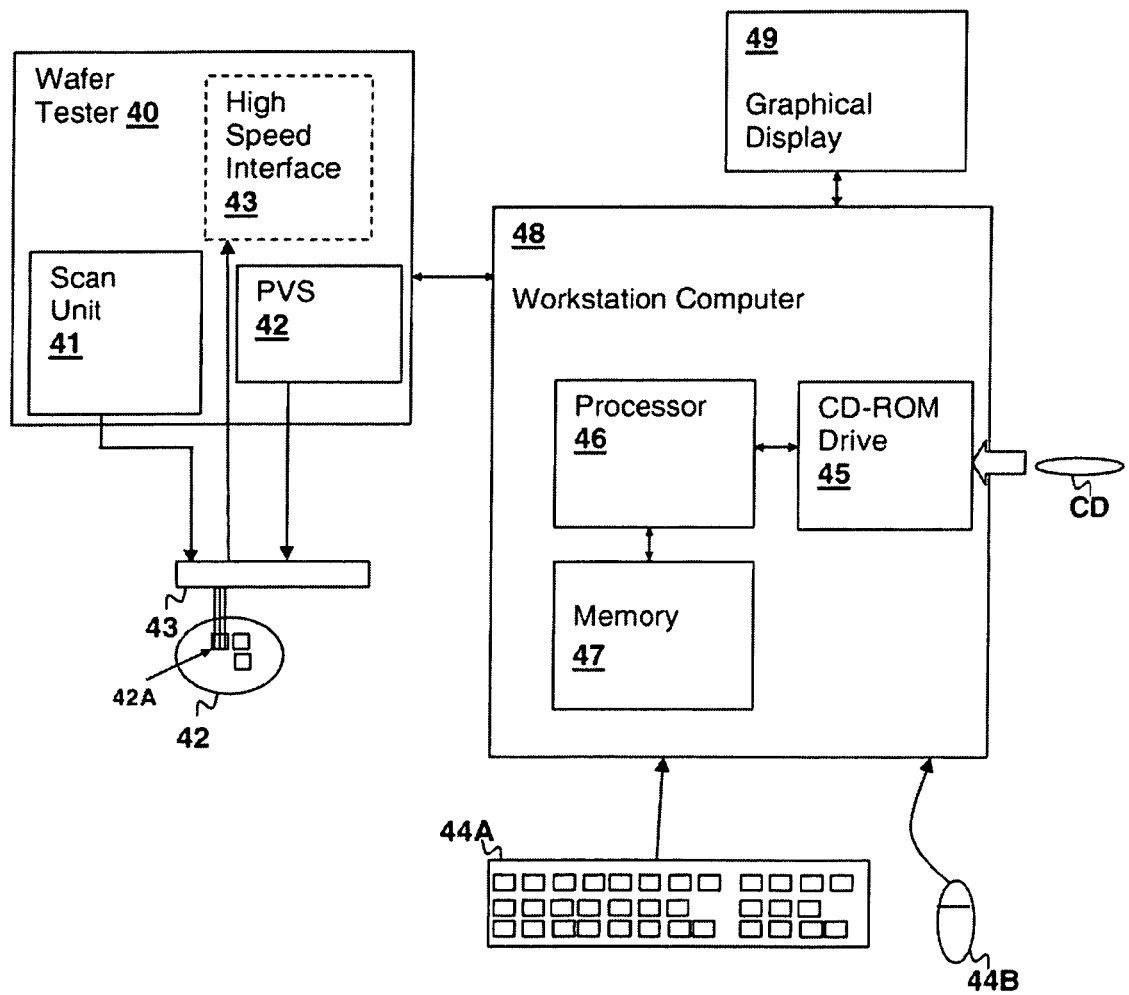
FIG. 7 is a pictorial diagram of a wafer test system in which methods in accordance with an embodiment of the present invention are performed.

Referring now to FIG. 7, a test measurement system in accordance with an embodiment of the present invention is shown. A workstation computer 48 includes a processor 46 for executing program instructions forming a computer program in accordance with an embodiment of the present invention, which may be stored on a media such as compact disc CD and loaded into memory 47 by processor 48 from a CD-ROM drive 45. A graphical display 49 is provided for displaying user interfaces for controlling measurements made by the test system of FIG. 7 and for displaying results of the measurements in tabular and/or graphical form. Input devices such as a keyboard 44A and a mouse 44B are included for controlling workstation computer system 48. Workstation computer system 48 is coupled to a wafer tester 40 having a test head 43 that is coupled by probes to a die 42A on a wafer 42. However, the present invention may also be practiced using packaged dies that include a test interface or other interface for controlling the test procedure and retrieving the test data. As mentioned above, wafer tester 40 may include a high-speed interface for transferring the measurement data of the present invention if local storage of the collected delay data (e.g., ring oscillator frequency and edge position for ring oscillator measurements, or delay edge position for delay-only measurements). A programmable voltage supply (PVS) 42 is included to provide the stress voltages applied to the delay elements. A scan unit 41 can be used to start and control the measurements, and to retrieve collected data when local measurement data storage is supplied on die 42A.

Figure 8:
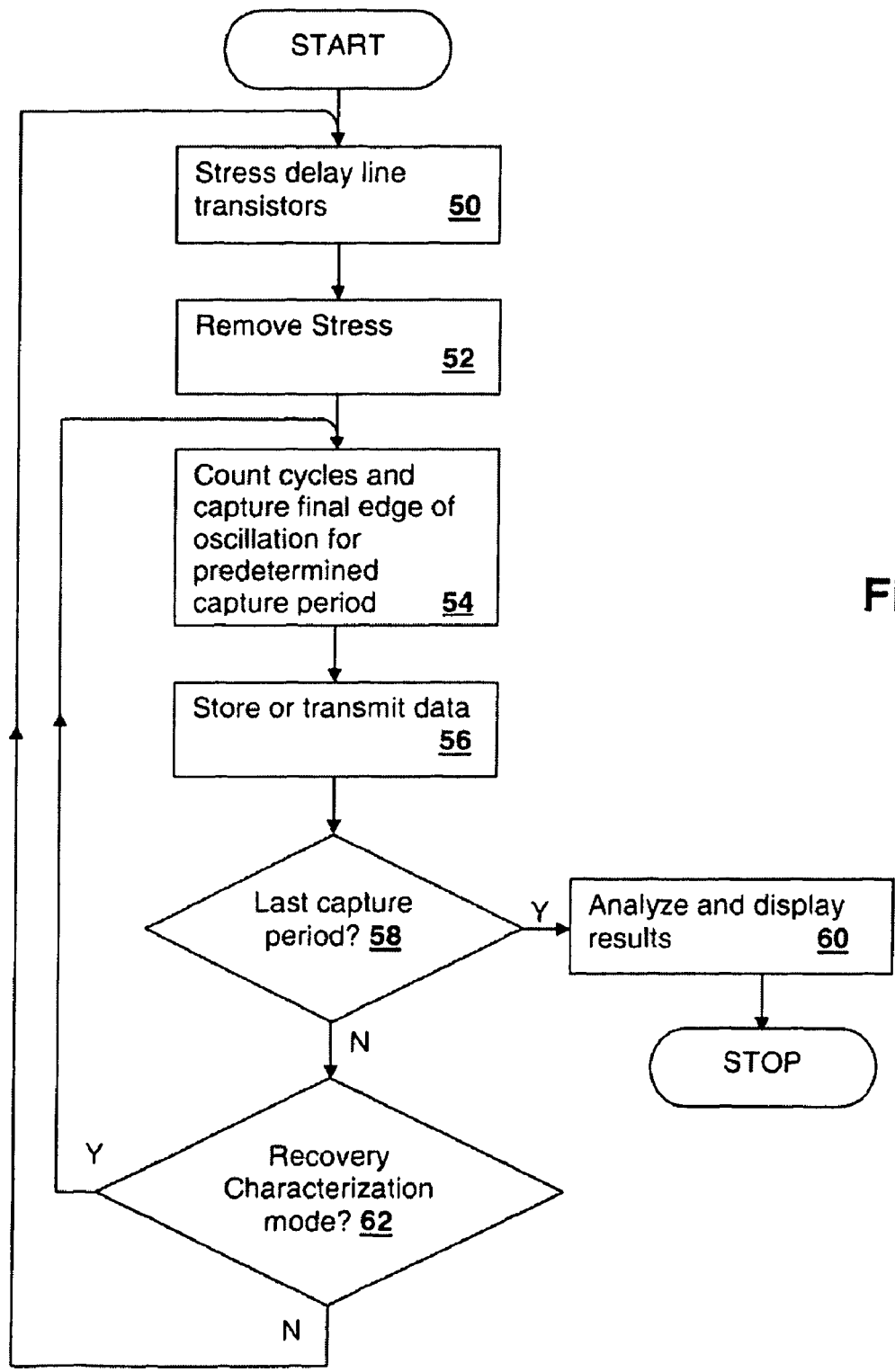
FIG. 8 is a flow chart of a method in accordance with an embodiment of the present invention.

Referring now to FIG. 8, a method in accordance with an embodiment of the present invention is shown in a flowchart. First, the delay line transistors are stressed (step 50). Next, the stress is removed (step 52), ring oscillator cycles are counted and the edge position of the final oscillation is captured for a predetermined capture period (step 54). The measurement data are stored or transmitted (step 56). After the last stress cycle (last capture period) is complete (decision 58) the collected delay indications are analyzed and displayed (step 60). Otherwise, if the measurement is performed in recovery characterization mode (decision 62), the measurement steps 54-56 are repeated. If the measurement is performed in a quasi-continuous stress mode (decision 62), the stress/measure cycles of steps 50-56 are repeated.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for measuring time-varying change in threshold voltage in a device under test due to voltage stress-induced bias temperature effect, the method comprising:
    applying stress to particular devices in a delay line formed with elements having delays substantially sensitive to only a stress-induced bias temperature effect of a single polarity in order to cause change in a delay of the delay line due to the stress-induced bias temperature effect;
    removing the stress;
    propagating a pulse through the delay line;
    detecting the position of an edge of the pulse at one of multiple outputs of the delay line at a predetermined time after commencing the propagating to provide an indication of the delay through the delay line;
    storing the indication of the delay;
    repeating the detecting and the storing to collect the indications of the delay from repetitions of the detecting; and
    computing an effect of the stress on the bias temperature effect on the particular devices in the delay line from the collected indications of the delay.

2. The method of claim 1, wherein the repeating repeats the applying and removing at each repetition of the repeating, such that the particular devices have not substantially recovered from the applied stress before a next repetition of the repeating after a previous repetition of the repeating, and wherein the computing computes a cumulative effect of multiple applications of the stress performed by the repeating.

3. The method of claim 1, wherein the delay line is a first delay line, and wherein the method further comprises:
    second propagating another pulse through a second delay line substantially identical to the first delay line, wherein the second delay line has not been stressed during a time preceding the second propagating such that the second delay line provides a reference delay;
    second detecting the position of an edge of the other pulse at an output of the second delay line to provide an indication of the reference delay;
    second storing the indication of the reference delay, wherein the repeating also repeats the second propagating, the second detecting and the second storing to collect the indications of the reference delay from repetitions of the second detecting; and
    normalizing the indications of the delay using the indications of the reference delay.

4. The method of claim 1, further comprising:
    re-circulating the pulse from a last output of the delay line to an input of the delay line, whereby the delay line forms a ring oscillator; and
    counting oscillations of the ring oscillator, wherein the detecting the position further uses a result of the counting to provide the indication of the delay, whereby an effective length of the delay line is increased by the re-circulating.

5. The method of claim 4, further comprising detecting the pulse within the delay elements after the pulse has propagated through a corresponding one of the transistors, wherein the detecting has a shorter delay with respect to an edge transitioning to a particular logic state to which the delay is less sensitive to the stress-induced bias temperature effect, whereby a frequency of the oscillations is increased.

6. The method of claim 5, wherein the delay elements comprise stages for propagating the pulse through drain-source connections of transistors previously stressed by the stressing, wherein the drain and source of the transistors are at the same DC potential prior to arrival of the pulse, wherein the gate of the transistors is held at a potential such that the transistors act as pass elements having an on-resistance dependent on a threshold voltage at least temporarily affected by the stressing, wherein the detecting is performed by an inverter having an input connected to one of the drain or the source of the transistors, and wherein the delay elements further comprise a speedup transistor having a gate connected to an output of the inverter, a drain connected to the input of the inverter and a source connected to a power supply rail for causing the detecting to have the shorter delay with respect to the edge transitioning to the particular logic state.

7. The method of claim 1, wherein the delay elements comprise stages for propagating the pulse through drain-source connections of transistors previously stressed by the stressing, wherein the drain and source of the transistors are at the same DC potential prior to arrival of the pulse, and wherein the gate of the transistors is held at a potential such that the transistors act as pass elements having an on-resistance dependent on a threshold voltage at least temporarily affected by the stressing.

8. A test workstation computer system including:
a memory for storing program instructions for characterizing time-varying change in threshold voltage in a device under test due to voltage stress-induced bias temperature effect;
a processor for executing said program instructions; and
a test interface coupled to a test circuit, wherein said program instructions comprise program instructions for controlling the test interface to apply stress to particular devices in a delay line formed with elements having delays substantially sensitive to only a stress-induced bias temperature effect of a single polarity in order to cause change in a delay of the delay line due to the stress-induced bias temperature effect, remove the stress, provide a pulse at the input of the delay line, wherein the test circuit detects the position of an edge of the pulse at one of multiple outputs of the delay line at a predetermined time after commencing the propagating to provide an indication of the delay through the delay line, store the indication of the delay, repeat the detecting the position of the edge of the pulse and the storing of the indication of the delay to collect the indications of the delay from repetitions of the detecting; and wherein the program instructions further comprise program instructions for receiving, at the test workstation computer system and over the interface, the indications of the delay from the test circuit, and computing an effect of the stress on the bias temperature effect on the particular devices in the delay line from the collected indications of the delay.

9. The test workstation computer of claim 8, wherein the program instructions for repeating repeat the applying and removing at each repetition of the repeating, such that the particular devices have not substantially recovered from the applied stress before a next repetition of the repeating after a previous repetition of the repeating, and wherein the program instructions for computing compute a cumulative effect of multiple applications of the stress performed by the repeating.

10. The test workstation computer of claim 8, wherein at each execution of the program instructions for repeating, the test circuit stores the corresponding indication of the delay in an internal storage, wherein the indications of delay are collected internal to the test circuit, and wherein the program instructions for receiving read the stored indications of the delay from the test circuit over the interface.

11. The test workstation computer of claim 8, wherein the test interface is a high speed interface, and wherein the program instructions for receiving are repeatedly executed by the program instructions for repeating, whereby the indications of delay are collected in a storage of the test workstation computer system.

12. The test workstation computer system of claim 8, wherein the test circuit has an internal feedback connection coupling an output of the delay line to an input of the delay line to form a ring oscillator and further comprises a counter for counting oscillations of the ring oscillator, and wherein the program instructions for receiving further receive a value of the counter.

13. A computer program product, comprising a non-transitory computer readable storage medium storing program instructions for execution within a test workstation computer system coupled to a test circuit by a test interface, the program instructions comprising program instructions for characterizing time-varying change in threshold voltage in a device under test due to voltage stress-induced bias temperature effect, wherein said program instructions comprise program instructions for controlling the test interface to apply stress to particular devices in a delay line formed with elements having delays substantially sensitive to only a stress-induced bias temperature effect of a single polarity in order to cause change in a delay of the delay line due to the stress-induced bias temperature effect, remove the stress, provide a pulse at the input of the delay line, wherein the test circuit detects the position of an edge of the pulse at one of multiple outputs of the delay line at a predetermined time after commencing the propagating to provide an indication of the delay through the delay line, store the indication of the delay, repeat the detecting and the storing to collect the indications of the delay from repetitions of the detecting, and wherein the program instruction further comprise program instructions for receiving, at the test workstation computer system and over the interface, the indications of the delay from the test circuit, and computing an effect of the stress on the bias temperature effect on the particular devices in the delay line from the collected indications of the delay.

14. The computer program product of claim 13, wherein the program instructions for repeating repeat the applying and removing at each repetition of the repeating, such that the particular devices have not substantially recovered from the applied stress before a next repetition of the repeating after a previous repetition of the repeating, and wherein the program instructions for computing compute a cumulative effect of multiple applications of the stress performed by the repeating.

15. The computer program product of claim 13, wherein the test interface is a high speed interface, and wherein the program instructions for receiving are repeatedly executed by the program instructions for repeating, whereby the indications of delay are collected in a storage of the test workstation computer system.

* * * * *